United States Patent
Ono et al.

(10) Patent No.: US 7,892,322 B2
(45) Date of Patent: *Feb. 22, 2011

(54) APPARATUS AND METHOD FOR SEPARATING GAS

(75) Inventors: Yoshinori Ono, Tokyo (JP); Takashi Futatsuki, Tokyo (JP); Tetsuya Abe, Ibaraki-ken (JP); Sadamitsu Tanzawa, Ibaraki-ken (JP); Seiji Hiroki, Ibaraki-ken (JP)

(73) Assignee: Japan Atomic Energy Agency, Ibaraki-ken (JP)

( * ) Notice: Subject to any disclaimer, the term of this patent is extended or adjusted under 35 U.S.C. 154(b) by 148 days.

This patent is subject to a terminal disclaimer.

(21) Appl. No.: 11/912,125

(22) PCT Filed: Apr. 19, 2006

(86) PCT No.: PCT/JP2006/308197

§ 371 (c)(1), (2), (4) Date: Oct. 19, 2007

(87) PCT Pub. No.: WO2006/112472

PCT Pub. Date: Oct. 26, 2006

(65) Prior Publication Data

US 2009/0056540 A1 Mar. 5, 2009

(30) Foreign Application Priority Data

Apr. 19, 2005 (JP) ............................. 2005-120668

(51) Int. Cl.
*B01D 53/04* (2006.01)
*B01D 53/70* (2006.01)

(52) U.S. Cl. ................... 95/88; 95/95; 95/128; 95/135; 95/142; 96/101; 96/134; 96/142

(58) Field of Classification Search .................. 96/4, 96/121, 127, 134, 135, 142, 101; 95/47, 95/95, 128, 135, 142, 88
See application file for complete search history.

(56) References Cited

U.S. PATENT DOCUMENTS 4,194,892 A * 3/1980 Jones et al. ..................... 95/95

(Continued)

FOREIGN PATENT DOCUMENTS

JP 63-69703 3/1988

(Continued)

OTHER PUBLICATIONS

Machine translation for JP 10-225609 A, published Aug. 1998.*

(Continued)

*Primary Examiner*—Frank M Lawrence
(74) *Attorney, Agent, or Firm*—Osha • Liang LLP

(57) ABSTRACT

An apparatus and a method for separating a specified gas from a gas to be treated containing the specified gas comprising at least one ingredient, which comprises allowing the gas to be treated to flow through a column without the use of another gas for transferring the gas to be treated, while keeping the inside of the column packed with a packing material at a reduced pressure. The above apparatus and method can be suitably used for separating a specified gas having a high purity at a low cost.

16 Claims, 8 Drawing Sheets

U.S. PATENT DOCUMENTS

| | | | | |
|---|---|---|---|---|
| 5,720,797 | A * | 2/1998 | Yates et al. | 95/96 |
| 5,840,953 | A | 11/1998 | Potts | |
| 6,004,377 | A * | 12/1999 | Tamata et al. | 95/82 |
| 6,454,837 | B1 * | 9/2002 | Pittroff et al. | 95/47 |
| 6,530,980 | B2 * | 3/2003 | Abe et al. | 96/4 |
| 7,527,676 | B2 | 5/2009 | Tajima et al. | |
| 2007/0084345 | A1 | 4/2007 | Tajima et al. | |
| 2009/0056552 | A1 * | 3/2009 | Ono et al. | 96/111 |

FOREIGN PATENT DOCUMENTS

| | | |
|---|---|---|
| JP | 63-315503 | 12/1988 |
| JP | 8-108046 | 4/1996 |
| JP | 8-141357 | 6/1996 |
| JP | 10-225609 | 8/1998 |
| JP | 2000-500457 | 1/2000 |
| JP | 2002-273144 | 9/2002 |
| KR | 10-2006-0041269 | 5/2006 |

OTHER PUBLICATIONS

International Search Report w/ English Translation for PCT/JP2006/308197 mailed May 30, 2006 (4 pages).

esp@cenet Patent Abstract for JP2002273144 dated Sep. 24, 2002 (1 page).

esp@cenet Patent Abstract for JP8141357 dated Jun. 4, 1996 (1 page).

esp@cenet Patent Abstract for JP10225609 dated Aug. 25, 1998 (1 page).

esp@cenet Patent Abstract for JP63069703 dated Mar. 29, 1988 (1 page).

esp@cenet Patent Abstract for JP8108046 dated Apr. 30, 1996 (1 page).

"Development of Technology of PFC Recovery/Reuse, (2) Development for Practical Utilization of Technology", Uemura Takashi, Published Online Mar. 2002, Semiconductor Leading Edge Technologies, Inc., PFC Final Debrief Session, and its partial translation (12 pages).

Japanese Office Action for Japanese Application No. 2005-120668, mailed on Apr. 8, 2008 (7 pages).

esp@cenet patent abstract for Japanese Publication No. 63315503, Publication date Dec. 23, 1988 (1 page).

esp@cenet patent abstract for Japanese Publication No. 2000500457, Publication date Jan. 18, 2000 (1 page).

Notification of Transmittal of Translation of the International Preliminary Report on Patentability (Chapter I or Chapter II of the Patent Cooperation Treaty) for International Application No. PCT/JP2006/308197 mailed on Sep. 18, 2008 (7 pages).

Notification Concerning Transmittal of International Preliminary Report on Patentability (Chapter I of the Patent Cooperation Treaty) for International Application No. PCT/JP2006/308197, mailed on Nov. 1, 2007 (6 pages).

Office Action for U.S. Appl. No. 12/171,972 dated Jun. 23, 2010, 6 pages.

Office Action for U.S. Appl. No. 12/171,972 dated Oct. 20, 2010, 6 pages.

English abstract of KR1020060041269 published on May 11, 2006, 1 page.

Office Action for Korean Application No. 10-2008-0067783 mailed on Sep. 16, 2010 and English translation thereof, 10 pages.

* cited by examiner

| TIME | (MINU-TE) | 0 | 2 | 10 | 12 | 20 | 22 | 30 | 32 | 40 | ... | ... |
|---|---|---|---|---|---|---|---|---|---|---|---|---|
| COLUMN 1 | INLET | GAS SUPPLY | | | | GAS SUPPLY | | | | GAS SUPPLY | | |
| | | | N₂ EXHAUST LINE | | RECOVER IN SF₆ LINE | | N₂ EXHAUST LINE | | RECOVER IN SF₆ LINE | | N₂ EXHAUST LINE | |
| COLUMN 2 | OUTLET | | | GAS SUPPLY | | N₂ EXHAUST LINE | | GAS SUPPLY | | N₂ EXHAUST LINE | | |
| | | RECOVER IN SF₆ LINE | | | | RECOVER IN SF₆ LINE | | | | RECOVER IN SF₆ LINE | | |

Fig. 7

APPARATUS AND METHOD FOR SEPARATING GAS

TECHNICAL FIELD

The present invention relates to an apparatus and a method for separating a specified gas from a gas to be treated containing the specified gas including at least one ingredient.

BACKGROUND ART

Conventionally, in a semiconductor manufacturing process, a liquid crystal manufacturing process or the like, various gases are used according to the process. For instance, in a dry-etching step, a thin-film-forming step or the like, gases of PFC (perfluoro compound) that is a compound containing fluorine such as $CF_4$, $NF_3$, $C_2F_6$, $C_3F_8$, $SF_6$, $CHF_3$ and $COF_2$, are used as a reactive gas, and an exhaust gas including them is produced.

An exhaust gas of these gases including the PFC gases is treated with various methods, because the gases have a high global warming potential and it is not preferable to discharge the exhaust gas outside in an untreated state. Such a treatment method includes a process of decomposing the PFC gas and removing its harmful effect by abatement treatment such as of a combustion type, a catalytic type, an adsorption type or a plasma decomposition type. However, in recent years, it is required to recover and reuse the PFC gas exhausted from a manufacturing process, from the viewpoint of environmental protection and energy savings.

When a PFC gas is exhausted from a manufacturing process, in general, the PFC gas is diluted with a large amount of nitrogen gas or the like so as to protect an exhaust line, a vacuum pump or the like, and is exhausted. At this time, the PFC gas is diluted to a concentration as low as several percent, though this depends on conditions. For this reason, when the PFC gas is subjected to harmful substance removal treatment, the PFC concentration process of removing nitrogen or the like from the exhaust gas is effective in order to remove nitrogen or the like that is unnecessary for the harmful substance removal treatment and increase treatment efficiency.

There is a method of separating a PFC gas from an exhaust gas by using a chromatographic separation technique that uses a chromatographic column containing various types of packing materials and reusing the separated PFC gas, as a method of concentrating and recovering the PFC gas. For instance, Japanese Patent Laid-Open Publication No. 2002-273144 proposes a gas separation apparatus which is directed at separating the specified gas from a gas to be treated containing the specified gas comprising a plurality of ingredients, and has a separation unit for chromatographically separating the specified gas from the gas to be treated by using a column packed with activated carbon.

In addition, other methods of concentrating and recovering the PFC gas include a membrane treatment method of separating the PFC gas from nitrogen or the like through a membrane, and a cryogenic distillation method of separating the PFC gas from nitrogen or the like by utilizing a difference between the boiling points of the PFC gas and nitrogen or the like.

For instance, technology for separating and recovering $CF_4$ from nitrogen gas containing 0.05% $CF_4$ by using a membrane treatment apparatus which employs polysulfonic polymer membranes stacked into three stages is described in "Development of Technology of PFC Recovery/Reuse, (2) Development for Practical Utilization of Technology", Uemura Takashi, P 7, 9, [online], March, 2002, Semiconductor Leading Edge Technologies, Inc., PFC Final Debrief Session, [searched on Apr. 14, 2005], <URL:http://www.selete.co.jp/SeleteHPJ1/Data/200204/0204c05.pdf>.

DISCLOSURE OF THE INVENTION

However, such a method of separating gases by using chromatography as is disclosed in the above described Japanese Patent Laid-Open Publication No. 2002-273144 provides a gas in the form of containing PFCs in a carrier gas, after having been separated from each other, because the method can separate the PFCs consisting of a plurality of ingredients in an exhaust gas from each other since nitrogen or the like is used as the carrier gas for the separation. Accordingly, the method further needs a particular concentration of the PFC, which removes nitrogen or the like to be an impurity from the separated gas, in order to recover and reuse the PFC gas.

On the other hand, a membrane treatment method can separate the PFC from nitrogen to some extent, but the concentration of the separated PFC is only about 90% even after having been separated by multistage membrane treatment. For instance, the concentration of $CF_4$ recovered from a nitrogen gas containing 0.05% $CF_4$ is 91% (recovery percentage: 97%) in the method disclosed by the above described "Development of Technology of PFC Recovery/Reuse (2), Development for Practical Utilization of Technology". For this reason, it is difficult to reuse the PFC gas separated by the membrane treatment method in a semiconductor manufacturing process or the like without being treated, though the PFC gas can be applied to a concentration step for the PFC prior to abatement treatment, because the PFC concentration is far lower than the concentration of a fresh PFC gas (99.99%).

Furthermore, a cryogenic distillation method needs a large scale apparatus which increases facility costs and running costs.

As described above, the fact is that there is not yet such technology as to be able to practically and industrially recover and reuse the PFC gas.

The present invention provides an apparatus and a method for inexpensively separating a specified gas with high purity from a gas to be treated containing the specified gas comprising at least one ingredient.

The present invention provides a gas separation apparatus for separating a specified gas from a gas to be treated containing a specified gas including at least one ingredient, which comprises: a separation unit that separating the specified gas from the other gases by using a column packed with a packing material; and a suction unit that controlling the inside of the column to a reduced pressure. The separation unit separates the specified gas without using another gas for transferring the gas to be treated.

In the gas separation apparatus, a pressure (gauge pressure) inside the column is preferably 1,000 Pa or lower.

The gas separation apparatus preferably further has a concentration unit that concentrating the specified gas in the gas to be treated.

The gas separation apparatus preferably further has a return unit that returning a treated gas which is not yet separated but has been exhausted from the separation unit, to the separation unit or the concentration unit.

The gas separation apparatus preferably further has the second concentration unit that concentrating the specified gas in the separated gas.

In addition, in the gas separation apparatus, the specified gas is preferably a PFC gas.

In the gas separation apparatus, the PFC gas is preferably characterized by including any one of fluorine compounds containing at least one constituent element selected from the group consisting of C, N and S.

In the gas separation apparatus, the PFC gas preferably includes any one compound selected from the group consisting of $CF_4$, $C_2F_6$, $C_3F_8$, $CHF_3$, $SF_6$, $NF_3$ and $COF_2$.

In the gas separation apparatus, the gas to be treated preferably includes nitrogen.

In the gas separation apparatus, the PFC gas is preferably $SF_6$ and the packing material is preferably Molecular Sieve 13X.

In the gas separation apparatus, the separation unit preferably employs a plurality of columns and sequentially uses the plurality of the columns.

The present invention provides a gas separation method for separating a specified gas from a gas to be treated containing a specified gas containing at least one ingredient, including separating the specified gas from the other gases by passing the gas to be treated through a column packed with a packing material while controlling the inside of the column at a reduced pressure. In the separating, a gas for transferring the gas to be treated is not used.

The gas separation method preferably further includes concentrating a specified gas contained in the gas to be treated prior to the separating.

The gas separation method preferably further includes returning a treated gas which is not yet separated but has been exhausted from the separating, to the separating or the concentrating.

The gas separation method preferably further includes second concentrating the specified gas in the separated gas, after the separating.

In the present invention, there are provided an apparatus and a method for separating a specified gas from a gas to be treated containing a specified gas including at least one ingredient, which comprises allowing the gas to be treated to flow through a column without the use of another gas for transferring the gas to be treated, while keeping the inside of the column packed with a packing material at a reduced pressure. The above apparatus and method can be suitably used for separating the specified gas having a high purity at a low cost.

BRIEF DESCRIPTION OF THE DRAWINGS

FIG. 7 is a view illustrating an operation sheet for two columns used in Example 3 according to the present invention.

BEST MODE FOR CARRYING OUT THE INVENTION

In the following, embodiments of the present invention will be described.

Figure 1:
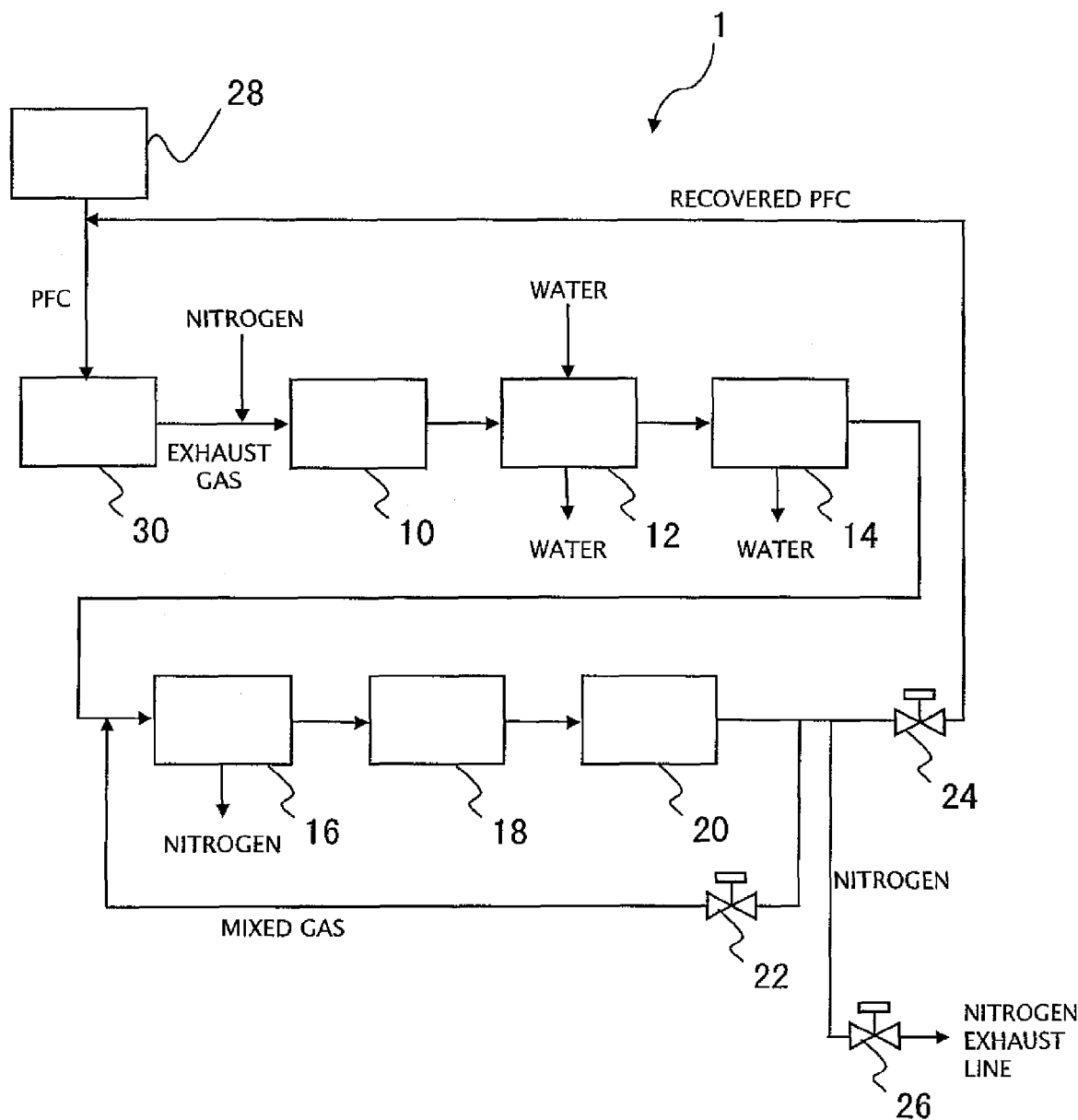
FIG. 1 is a view illustrating an outline of one example of a gas separation apparatus according to an embodiment of the present invention.

An outline of one example of a gas separation apparatus according to an embodiment of the present invention is shown in FIG. 1 and the configuration will now be described. The gas separation apparatus 1 comprises a vacuum pump 10, a scrubber 12, a dehydrator 14, a concentrator 16 that is a concentration unit, a separator 18 that is a separation unit, a vacuum pump 20 for a column that is a suction unit, and valves 22, 24 and 26.

In the gas separation apparatus 1 in FIG. 1, a sucking side of a vacuum pump 10 is connected to a manufacturing process 30 or the like such as a dry etching step or a thin-film-forming step such as CVD (chemical vapor deposition) in a semiconductor manufacturing process, a liquid crystal manufacturing process or the like, and a discharging side of the vacuum pump 10 is connected to the inlet of a scrubber 12. The outlet of the scrubber 12 is connected to the inlet of a dehydrator 14, and the outlet of the dehydrator 14 is connected to the inlet of a concentrator 16. The outlet of the concentrator 16 is connected to the inlet of the separator 18, the outlet of the separator 18 is connected to the sucking side of the vacuum pump 20 for the column, and the discharging side of the vacuum pump 20 for the column is connected to a pipe for introducing a gas to the concentrator 16, a pipe for supplying a PFC gas in a manufacturing process 30, and a nitrogen exhaust system, through valves 22, 24 and 26 respectively.

A method for separating a gas and an operation of a gas separation apparatus 1 according to the present embodiment will now be described. In the gas separation apparatus 1 of FIG. 1, a PFC gas is supplied from a PFC gas feeder 28 to a manufacturing process 30 such as a dry etching step and a thin-film-forming step in a semiconductor manufacturing process, a liquid crystal manufacturing process or the like. In the manufacturing process 30, an exhaust gas containing a PFC gas is produced and is exhausted from the manufacturing process 30 by a vacuum pump 10.

Here, in the manufacturing process 30, the PFC gas is decomposed to form a hydrofluoric acid (HF). Accordingly, an exhaust gas contains the hydrofluoric acid. For this reason, when the exhaust gas is introduced into a path of the exhaust gas and a vacuum pump 10 in as exhausted state, the exhaust gas may corrode the path of the exhaust gas and may damage the vacuum pump 10. For this reason, nitrogen gas or the like is supplied as a dilution gas into the path of the exhaust gas leading to the vacuum pump 10 to dilute the exhaust gas.

An exhaust gas that has been diluted with nitrogen and is discharged from a discharging side of a vacuum pump 10 is supplied to a scrubber 12. There, hydrofluoric acid (HF) in the exhaust gas is removed by a shower of water.

An exhaust gas discharged from a scrubber 12 is introduced into a dehydrator 14. There, moisture content is removed. The reason for removing the moisture content is that the exhaust gas contains a lot of moisture in the scrubber 12 and the moisture content is preferably removed for a post-treatment step. In addition, a particulate removal filter (not shown) may be arranged upstream of the scrubber 12 or downstream of the dehydrator 14 with respect to a gas flow direction. Then, the particulate removal filter can remove fine particles of semiconductor, inorganic and organic insulation materials, a metal or the like, in the exhaust gas.

The thus obtained exhaust gas containing a PFC gas and nitrogen is supplied to a concentrator 16. The concentrator 16 is a device for removing nitrogen to some extent before the exhaust gas is introduced into a separator 18. As a result, nitrogen is removed from the exhaust gas to some extent and the PFC gas is concentrated.

After a PFC gas has been concentrated as described above, the gas to be treated is supplied to a separator 18. The separator 18 has a column packed with a desired packing material therein. The gas to be treated is passed into the column from the inlet of the column. In addition, the outlet of the column of the separator 18 is connected to the sucking side of a vacuum pump 20 for the column. The vacuum pump 20 for the column puts the inside of the column in a reduced pressure state. Thereby, the gas to be treated is made to pass through the inside of the column while contacting a packing material in the column, and is separated into the PFC gas and nitrogen gas because gas ingredients contained in the gas to be treated have retention times that are different from each other.

Because nitrogen generally has a low adsorptive power with respect to a packing material, nitrogen flows out from a column earlier than a PFC gas. The separator 18 separates the PFC gas from nitrogen by exhausting the PFC gas after having made nitrogen flow out. In the above step, the separator 18 may produce a fraction of a mixed gas of nitrogen and PFC in between fractions of nitrogen and PFC. In this case, the fraction may be returned to an inlet side of a concentrator 16. For instance, the gas separation apparatus passes a predetermined amount of a gas to be treated into the column while drawing the column with a vacuum pump 20 for the column, separately collects the fraction containing nitrogen and the fraction containing the PFC, and returns the fraction of the mixed gas of nitrogen and the PFC to the inlet side of the concentrator 16.

Specifically, the fraction containing the PFC separated in the column of the separator 18 is recycled through a valve 24 to be reused in a manufacturing process 30. The fraction containing nitrogen separated in the column of the separator 18 is exhausted in a nitrogen exhaust system through a valve 26, or is reused for diluting an exhaust gas discharged from the manufacturing process 30. The fraction of the mixed gas of nitrogen and the PFC, which has not been completely separated into the PFC gas and nitrogen gas in the column of the separator 18, is returned to the inlet side of the concentrator 16, and is subjected to concentration treatment and separation treatment by the separator 18 again. The fraction of the mixed gas of nitrogen and the PFC may be returned to the inlet side of the separator 18, though this depends on the concentration of the PFC.

In FIG. 1, for instance, the gas separation apparatus intermittently supplies a gas to be treated containing SF 6 and nitrogen to a separator 18, while controlling a column into a reduced pressure state with a vacuum pump 20 for a column. Then, the gases of nitrogen, a mixture of nitrogen and $SF_6$, and $SF_6$ flow out in that order from the separator 18. The gas separation apparatus discharges these gases while sequentially switching valves 22, 24 and 26 in an outlet side and separating the gases. Specifically, when discharging nitrogen from the separator 18, the gas separation apparatus opens the valve 26 and closes the valves 22 and 24 to discharge nitrogen. When discharging the mixed gas of nitrogen and $SF_6$ from the separator 18, the gas separation apparatus opens the valve 22, and closes the valves 24 and 26 to deliver the mixed gas of nitrogen and $SF_6$ for re-separation. Furthermore, when discharging $SF_6$ from the separator 18, in the gas separation apparatus, the valve 24 is opened and the valves 22 and 26 are closed to reuse $SF_6$ in a manufacturing process 30.

The gas separation apparatus in the present embodiment controls a column in a separator 18 to a reduced pressure state, and does not use a carrier gas, that is, a gas for transferring a gas to be treated. A usual method for separating gases by using column chromatography uses a carrier gas such as nitrogen, as a moving phase for the gas to be treated. Accordingly, even though a plurality of ingredients contained in the gas to be treated have been separated into each ingredient, each of the separated ingredients has a form of being contained in a large amount of the carrier gas, and needs to be further concentrated by a membrane separation technique, a cryogenic distillation technique or the like, in order to isolate each of the separated ingredients. However, a method of separating the gas to be treated without using the transfer gas as shown in the present embodiment does not need a further concentration operation but can easily isolate a specified gas in the gas to be treated. In other words, in the usual method for separating gases by using the column chromatography, the concentration of the gas to be separated is lower in a column outlet than in a column inlet, because the carrier gas is used, whereas in the apparatus and method for separating a gas according to the present embodiment, the concentration of the gas to be separated is higher in the column outlet than in the column inlet.

An apparatus and method for separating a gas according to the present embodiment can treat any mixed gas, but targets, for instance, an exhaust gas discharged in manufacturing processes such as dry etching or thin-film formation in a semiconductor manufacturing process, a liquid crystal manufacturing process or the like, or in a process of manufacturing a solar cell. The apparatus and method for separating a gas preferably targets a gas containing a PFC gas discharged from the semiconductor manufacturing process or the like, in particular, a gas containing the PFC gas and nitrogen discharged from the semiconductor manufacturing process or the like, among the above described gases, for treatment.

A specified gas to be separated (concentrated) among gases contained in a gas to be treated includes a PFC gas, nitrogen gas, oxygen gas, hydrogen gas, helium gas and argon gas, but is preferably the PFC gas. The PFC gas includes any one of fluorine compounds containing at least one constituent element among C, N and S, and specifically includes any one of $CF_4$, $C_2F_6$, $C_3F_8$, $CHF_3$, $SF_6$, $NF_3$ and $COF_2$. The specified gas contained in the gas to be treated may be one kind or plural kinds. When the gas separation apparatus separates the plural kinds of the specified gases, the apparatus can easily separate the specified gases from each other by appropriately selecting a type of packing material, a passing condition in a column or the like so that the retention time for each specified gas can be different from each other.

A scrubber 12 is for dissolving hydrofluoric acid (HF) or the like, that is contained in an exhaust gas, into water to remove the acid by a shower of water, and may be any known scrubber.

A dehydrator 14 can adopt any type, but preferably adopts a type which removes moisture content by lowering the temperature of an exhaust gas.

A concentrator 16 is for removing nitrogen to some extent before an exhaust gas is introduced into a separator 18, and is preferably a membrane separator using a gas permeable membrane. The concentrator 16 can employ a cryogenic distillation separator as well. Specifically, a PFC gas has a boiling point greatly different from that of nitrogen. Accordingly, the PFC gas can be easily separated from nitrogen by using the difference of the boiling point, and can be concentrated.

The concentrator 16 concentrates a specified gas normally into 80 vol. % to 90 vol. % by concentration with respect to the total amount of gases.

A usable packing material in a column of a separator 18 includes silica gel, activated carbon, Molecular Sieve such as 3A, 4A, 5A and 13X, and zeolite. The packing material may be selected from among those materials according to a type of a gas contained in a gas to be treated or the like. For instance, when the gas to be treated is a mixed gas of $CF_4$ and $C_2F_6$, Molecular Sieve 13X is used as the packing material; when the gas to be treated is a mixed gas of $NF_3$ and $SF_6$, Molecular Sieve 13X is used as the packing material; when the gas to be treated is a mixed gas of $CF_4$ and $CHF_3$, the activated carbon is used as the packing material; and when the gas to be treated is a mixed gas of $CF_4$ and $NF_3$, the activated carbon is used as the packing material. Thereby, the respective packing materials can effectively separate the respective mixed gases.

A pressure in a column of a separator 18 (gauge pressure in column outlet) may be lower than atmospheric pressure, but specifically shall be 1,000 Pa or lower, preferably 100 Pa or lower, and further preferably shall be a vacuum state of 10 Pa or lower. When a reduced pressure in the column exceeds 1,000 Pa, gases may not be sufficiently separated. In addition, a vacuum pump 20 for the column is preferably operated at all times.

A flow rate of a gas to be treated intermittently supplied into a column of a separator 18 may be determined according to a separation condition such as a type of a gas contained in the gas to be treated, a size of the column and a column temperature, and is not limited in particular, but is in a range of 0.1 L/time to 50 L/time, for instance.

A flow velocity of a gas to be treated in a column of a separator 18 may be determined according to a separation condition such as a type of the gas to be treated, a size of the column and a column temperature, and is not limited in particular. However, when a length of the column is 1 m for instance, the flow velocity is in a range of 0.1 SLM (standard liter per minute) to 50 SLM, and preferably is in a range of 1 SLM to 10 SLM.

A temperature inside a column of a separator 18 may be determined according to a separation condition such as a type of a gas contained in a gas to be treated and a size of the column, and is not limited in particular. However, the temperature is preferably in a range of 20° C. to 200° C., and is further preferably in a range of 35° C. to 150° C. When the temperature inside the column is lower than 20° C., gases may not be sufficiently separated. When the temperature exceeds 200° C., a packing material may be decomposed.

In addition, a buffering tank for pooling a gas to be treated may be arranged in between a concentrator 16 and a separator 18. The buffering tank may have a normal pressure, or may be a pressurizing type for increasing a storage amount.

A gas of each ingredient is collected in an outlet of a separator 18 or a valve in FIG. 1 is switched preferably on the basis of a result of an analysis for an outlet gas. The ingredient can be detected by using, for instance, a quadrupole mass spectrometer (QMS), a thermal conductivity detector (TCD), a Fourier transform infrared spectroscopy (FT-IR) or the like. The timing of the above collection or switching may be controlled on the basis of the result. In the present embodiment, the quadrupole mass spectrometer (QMS) is preferably used. Alternatively, the switching of the valves or the like during normal operation may be controlled by time, if a switching condition of the valves is previously determined on the basis of the result of the analysis by QMS or the like.

The gas is separated into each ingredient by such processing, so that in a fraction of a PFC gas or a fraction of nitrogen, for instance, the obtained gas hardly includes other substances and is pure.

In addition, it is also preferable to prepare a plurality of columns as separators 18, sequentially supply a gas to be treated to each column, and sequentially collect each fraction from each column.

Figure 2:
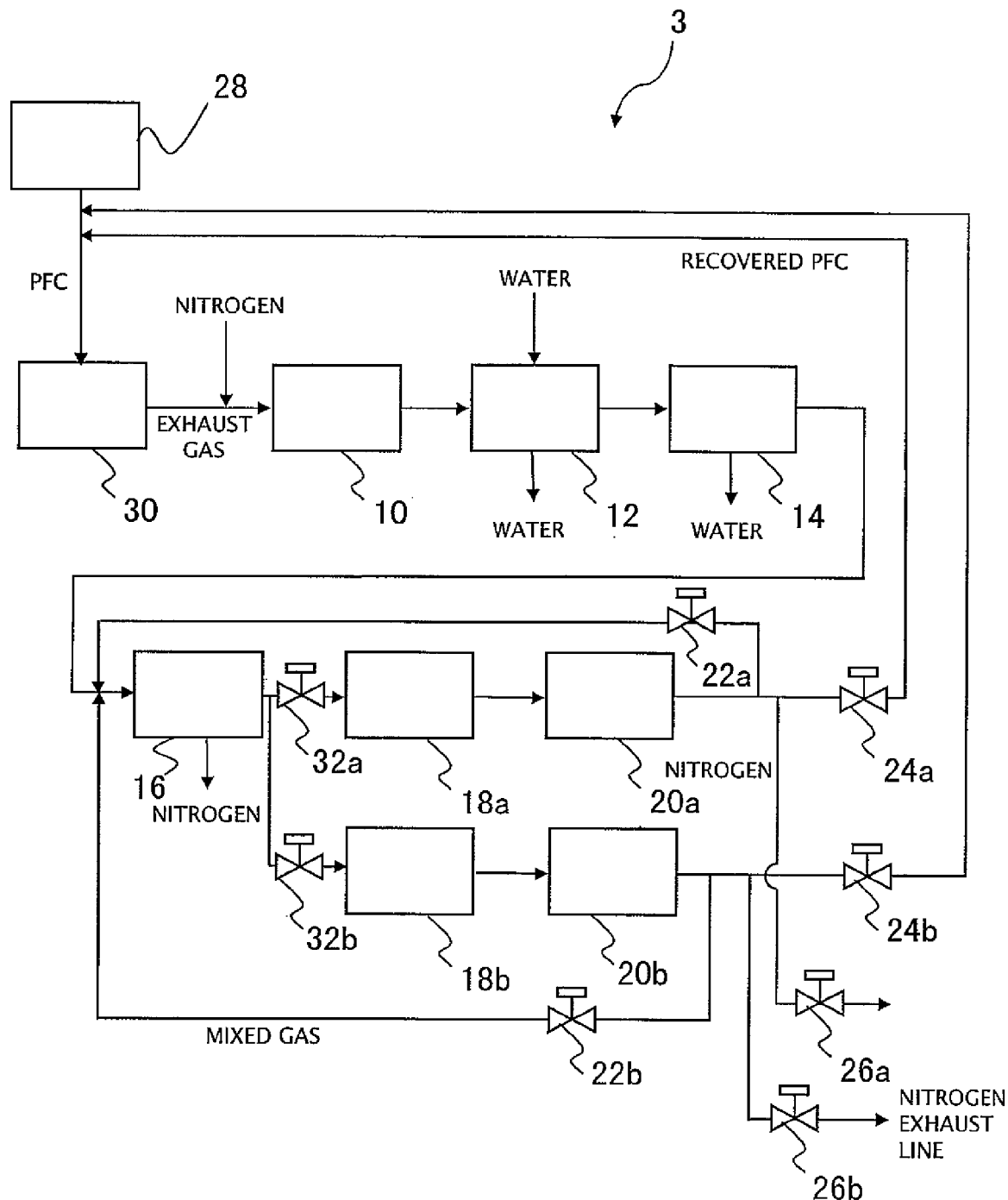
FIG. 2 is a view illustrating an outline of another example of a gas separation apparatus according to an embodiment of the present invention.

FIG. 2 shows an example of a structure for obtaining fractions by preparing two separators 18a and 18b and sequentially supplying the gas to be treated to the separators. The structure sequentially passes the gas to be treated containing, for instance, $SF_6$ and nitrogen into the separators 18a and 18b, while controlling a column into a reduced pressure state with vacuum pumps 20a and 20b for the column respectively, and sequentially switching valves 32a and 32b at inlet sides of the separators. Then, gases of nitrogen, a mixture of nitrogen and $SF_6$, and $SF_6$ are discharged in this order from the respective separators 18a and 18b. The structure discharges these gases independently by sequentially switching the valves 22a, 24a and 26a, and, 22b, 24b and 26b in the outlet sides of the separators. Specifically, when nitrogen is discharged from the separator 18a, the structure opens the valve 26a and closes the valves 22a and 24a to discharge nitrogen. In addition, when the mixture of nitrogen and $SF_6$ is discharged from the separator 18a, the structure opens the valve 22a and closes the valves 24a and 26a to deliver the mixture of nitrogen and $SF_6$ for re-separation. Furthermore, when $SF_6$ is discharged from the separator 18a, the structure opens the valve 24a and closes the valves 22a and 26a to make a manufacturing process 30 reuse the $SF_6$. On the other hand, when nitrogen is discharged from the separator 18b, the structure opens the valve 26b and closes the valves 22b and 24b to discharge nitrogen. In addition, when the mixture of nitrogen and $SF_6$ is discharged from the separator 18b, the structure opens the valve 22b and closes the valves 24b and 26b to deliver the mixture of nitrogen and $SF_6$ for re-separation. Furthermore, when $SF_6$ is discharged from the separator 18b, the structure opens the valve 24b and closes the valves 22b and 26b to make the manufacturing process 30 reuse the $SF_6$.

In such a manner, the structure having a plurality of separators 18 combined with each other can improve separation efficiency. In FIG. 2, two separators 18 and two vacuum pumps 20 for columns were used, but three or more separators and vacuum pumps may be combined, or alternatively, two separators 18 and one vacuum pump 20 for a column may be also combined. The number of separators 18 and vacuum pumps 20 for columns may be optimally selected according to the number of ingredients to be separated, a volume of a gas to be treated or the like.

Further alternatively, a plurality of columns containing different types of packing materials may be serially connected, though this depends on an ingredients of a gas to be treated.

In the present embodiment, a pure gas ingredient can be obtained in an outlet of a separator 18, but the ingredients separated by the separator 18 may be further concentrated by a second concentrator (not shown). A membrane separator or a cryogenic distillation separator can be used for the second concentrator as in the above described concentrator 16.

As described above, a gas separation apparatus according to the present embodiment can easily concentrate a PFC in a gas to be treated containing the PFC such as $SF_6$, and nitrogen, with high purity, by passing the gas to be treated through a column without using a gas for transferring the gas to be treated, while controlling the inside of the column packed with a packing material into a reduced pressure state. Accordingly, the gas separation apparatus can recover and reuse the separated PFC such as $SF_6$. Hence, the gas separation apparatus can recover and reuse the PFC particularly in a semiconductor manufacturing process, a liquid crystal manufacturing process or the like, which requires the PFC of a source gas a high concentration of 99.999% or higher.

In addition, a gas separation apparatus according to the present embodiment has a concentrator 16 arranged in a prior stage of a separator 18 to temporarily remove nitrogen. As a result, the separator 18 can efficiently separate a PFC into a high concentration.

Nitrogen obtained from a concentrator 16 and a separator 18 is reused for diluting an exhaust gas sent from a manufacturing process 30, as described above. The nitrogen gas can be reused in as collected state without causing any problem, but when the nitrogen gas contains a slight amount of PFC gas, the nitrogen gas may be treated so as to remove the PFC gas. As the process, it is preferable to employ a conventionally known process for decomposing the PFC gases, such as a plasma decomposition process, a combustion process and a catalyst heating process. Furthermore, it is also acceptable to again subject the nitrogen gas to membrane treatment, cryogenic distillation separation step, a column separation step or the like to separate the PFC gas, and reuse the nitrogen gas.

EXAMPLES

In the following, the present invention will be more specifically described in detail with reference to examples and comparative examples, but the present invention is not limited to the examples described below.

Example 1

Figure 3:
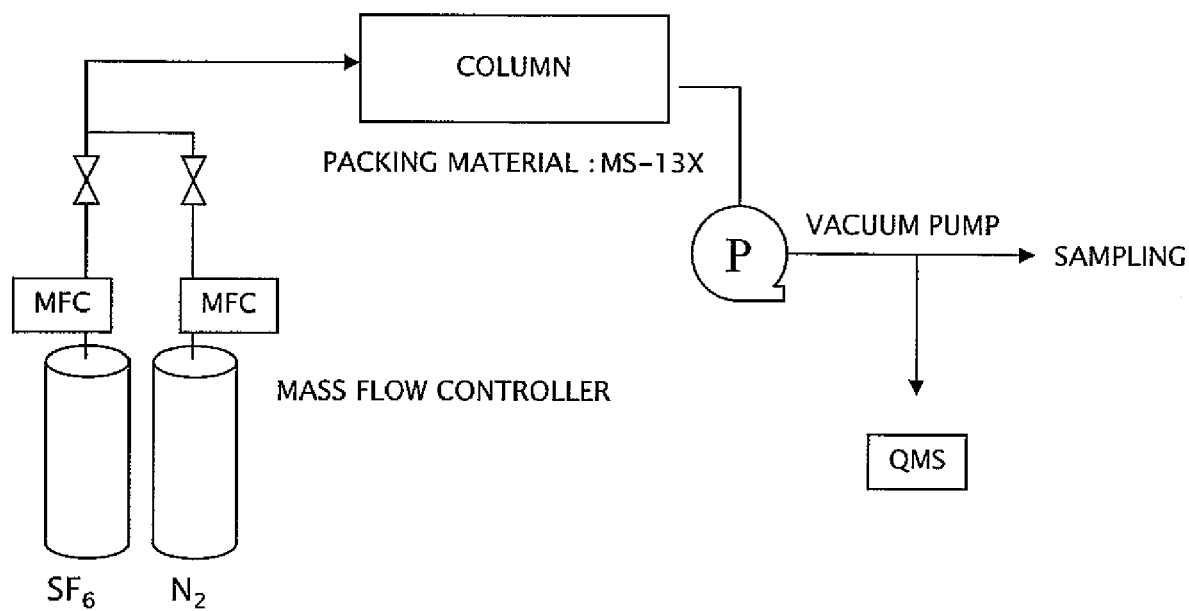
FIG. 3 is a view illustrating an outline of a gas separation apparatus used in Examples 1 and 2 according to the present invention.

A mixed gas (gas to be treated) of $SF_6$ of a PFC and nitrogen was separated by using an experimental apparatus shown in FIG. 3. The used column had an inner diameter of 54.9 mm and a length of 1.0 m. A column temperature was set at 120° C., and Molecular Sieve 13X (a product made by GL Sciences Inc.) was used as a packing material. A pressure at a column outlet was set at a reduced state of about $1.0 \times 10^{-3}$ Pa with a vacuum pump, a mixed gas of $SF_6/N_2$ ($SF_6$: 0.9 SLM, $N_2$: 0.1 SLM→$SF_6$ concentration: 90%) was introduced for two minutes, a gas supply operation was stopped, and only a discharging operation was conducted by the vacuum pump.

Figure 4:
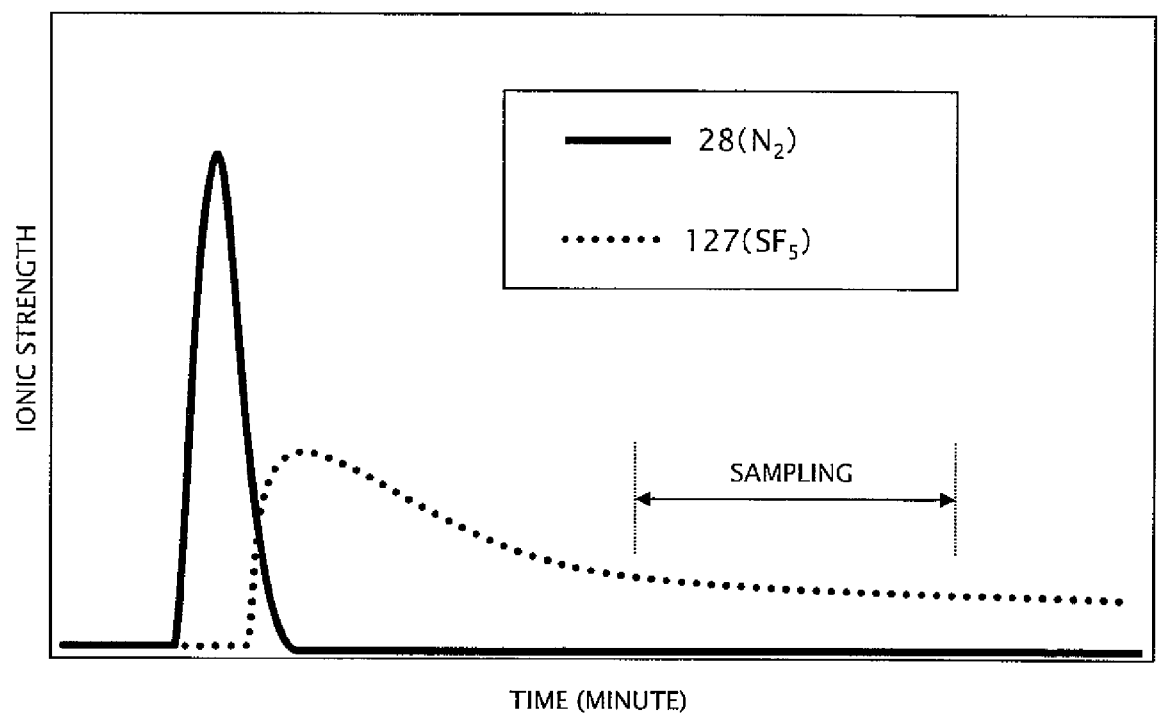
FIG. 4 is a view illustrating a result of a QMS analysis for an outflow gas in Example 1 according to the present invention.

As a result of this, nitrogen was discharged at first, and $SF_6$ was discharged later. Thus, it was confirmed that both gases were separated. A QMS (RG-202P (special type) made by Ulvac Inc.) was used for analysis. As a result of having collected and analyzed an $SF_6$ sample discharged later while monitoring the QMS analysis result, the concentration of the $SF_6$ gas was confirmed to be 99.9% or higher. FIG. 4 shows the result of the analysis for an outflow gas by using the QMS. The QMS ionizes molecules and detects $N_2$ by a mass number of 28 ($N_2$) and $SF_6$ by a mass number of 127 ($SF_5$), from which one F is removed. Accordingly, a discharged state of the gases from a column and a separated state of the gases in the column are grasped by observing the behavior of the mass number.

Example 2

A test was conducted by using the same apparatus as in Example 1, introducing four batches of a mixed gas of $SF_6/N_2$ ($SF_6$: 0.9 SLM, $N_2$: 0.1 SLM→$SF_6$ concentration: 90%) into one column in a pulsing way, and continuously treating them. The test was conducted by supplying the mixed gas for two minutes while exhausting a gas in the column through the outlet with a vacuum pump, making the gas separation apparatus conduct only an exhaust operation by the vacuum pump for 18 minutes, and making the gas separation apparatus repeat the supply and exhaust operations four times. A period of time required for one batch was 20 minutes.

Figure 5:
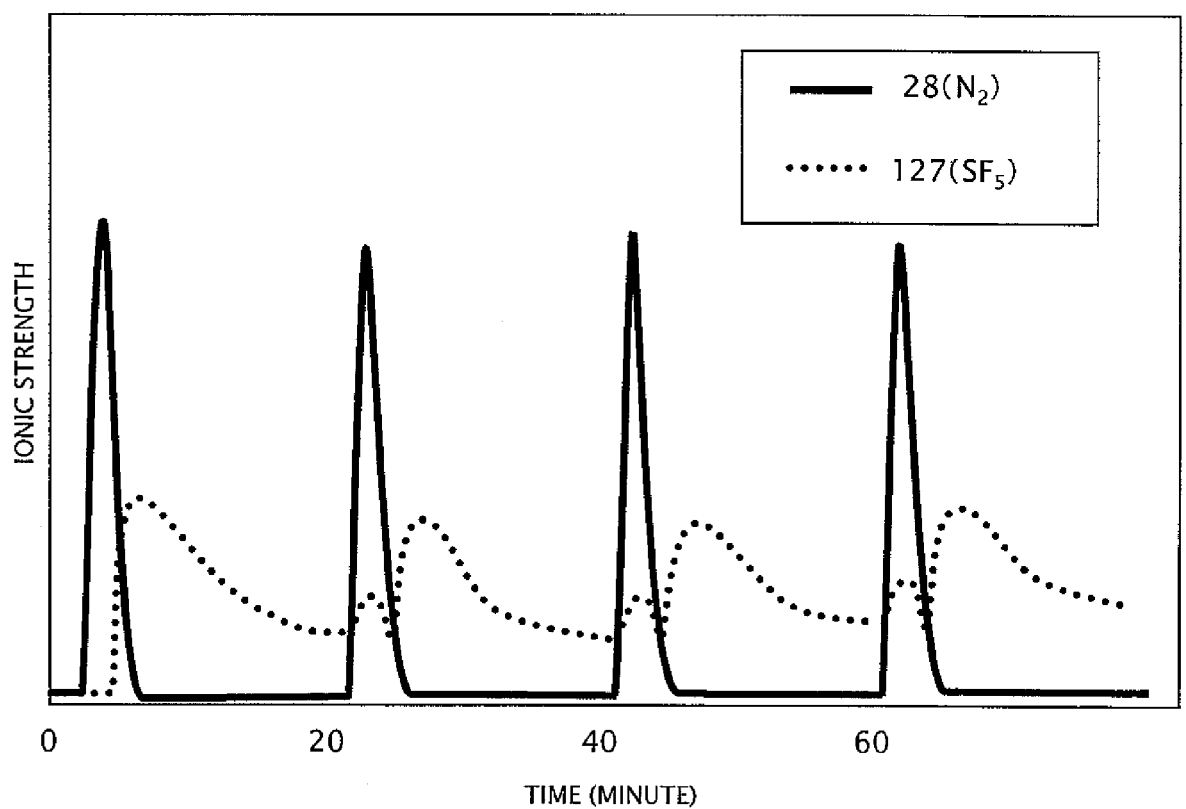
FIG. 5 is a view illustrating a result of a QMS analysis for an outflow gas in Example 2 according to the present invention.

FIG. 5 shows the result of the analysis for an outflow gas by using the QMS. As a result of the test, concentrated $SF_6$ was stably and repeatedly obtained. As a result of having collected and analyzed an $SF_6$ sample discharged later while monitoring the QMS analysis result, the concentration of the $SF_6$ gas was recognized to be 99.9% or higher, as in the case of Example 1. Nitrogen exhausted in an early stage after a second batch is contaminated by the $SF_6$ remaining in the column, but the mixed gas can be reused by returning the mixed gas to a concentrator such as a membrane separator that conducts pre-treatment directly upstream of a separator, mixing the mixed gas with a raw exhaust gas and removing nitrogen from the resulting mixed gas. The gas from which $N_2$ has been removed is returned to the separator and can be concentrated to a high concentration of the $SF_6$ gas.

Example 3

Figure 6:
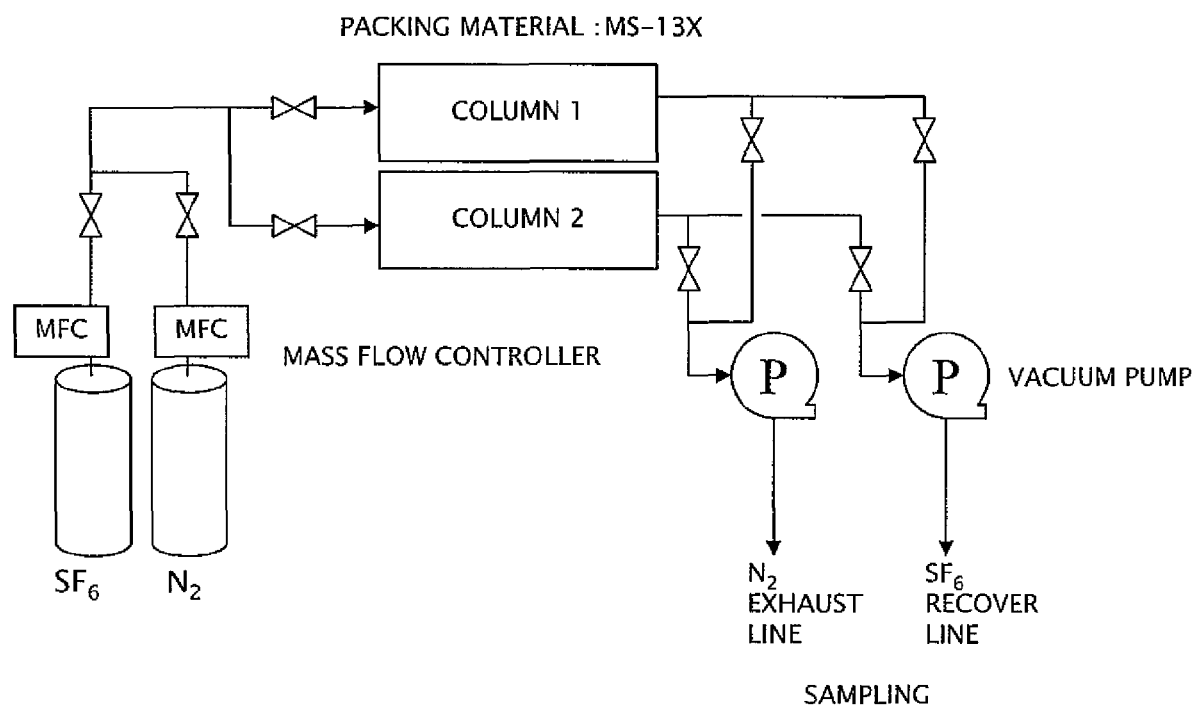
FIG. 6 is a view illustrating an outline of a gas separation apparatus used in Example 3 according to the present invention.
Figure 8:
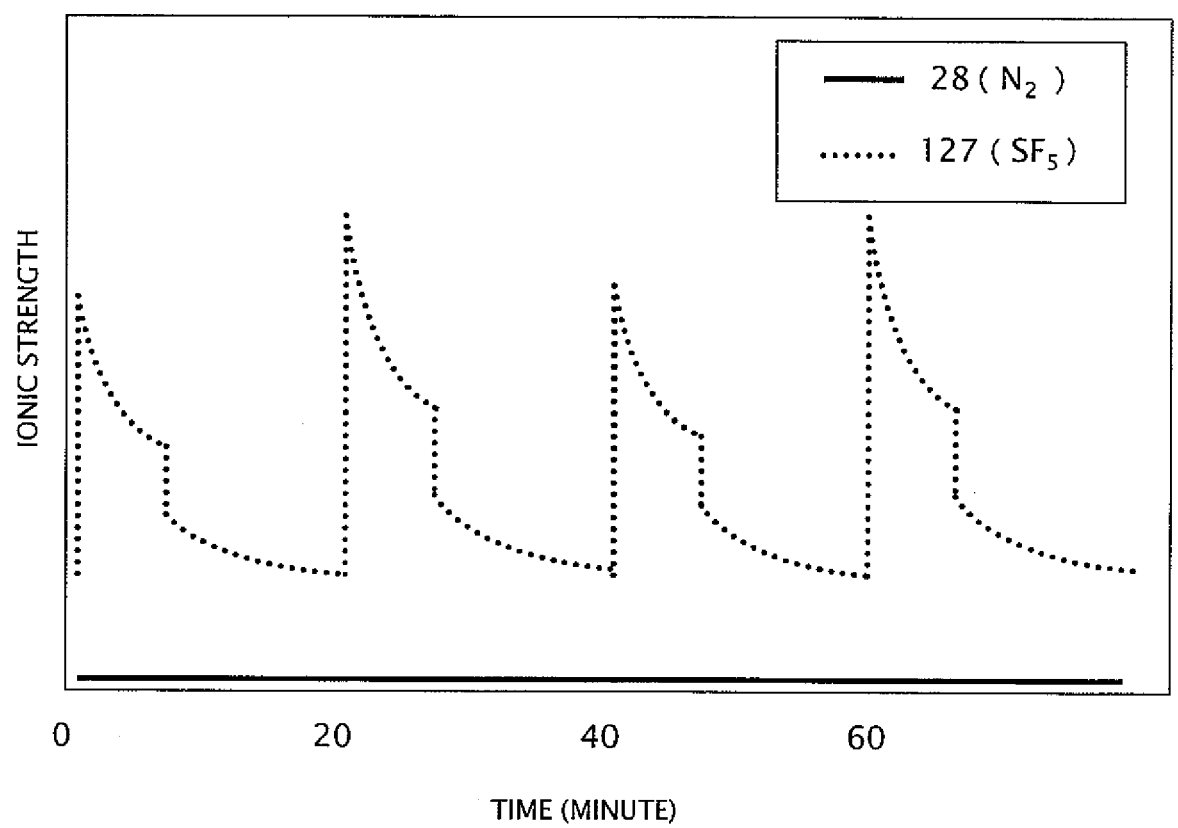
FIG. 8 is a view illustrating a result of a QMS analysis for an outflow gas in Example 3 according to the present invention.

A mixed gas of $SF_6$ and nitrogen was separated into each ingredient by using an experimental apparatus employing two columns as shown in FIG. 6. Two lines of outlets were arranged for each column in consideration of the result in Example 2. One was an exhaust line for mainly discharging $N_2$, and the other is a line for recovering $SF_6$. The mixed gas was separated on the basis of an operation sheet as shown in FIG. 7. The mixed gas was supplied to each column while switching a column inlet, and the mixed gas was alternately supplied to each column for two minutes in every 10 minutes. In this experiment, the mixed gas was not continuously supplied. However, the mixed gas can be continuously supplied by changing a flow velocity of the supply (for instance, five times that of Example 1), or by increasing the number of columns (for instance, five columns). Valves of the column outlets were also switched every 10 minutes. Thereby, each recovery line was separated, and only a high purity of the $SF_6$ gas flows into a $SF_6$ recovery line in particular. As a result of having collected and analyzed the sample, the concentration of the $SF_6$ gas was recognized to be 99.9% or higher, as in Example 1. FIG. 8 shows the result of the analysis for an outflow gas by using the QMS. The $SF_6$ gas in a mixed gas of the $N_2$ exhaust line can be efficiently separated from $N_2$ and recovered, by returning the mixed gas to a concentrator directly upstream of a separator as in Example 2, removing $N_2$ from the mixed gas, and passing the remaining gas through the column again.

Comparative Example 1

Comparison with a Membrane Concentrator

A mixed gas was separated according to a membrane concentration method reported by Semiconductor Leading Edge Technologies, Inc. (popularly called Selete) in March, 2002, which was adopted for a comparative method as an example of a general PFC membrane concentration technology. As a result, the concentration of the obtained $SF_6$ was 91%.

A mixed gas containing $SF_6$ and $N_2$ was separated into $SF_6$ and $N_2$, and the $SF_6$ could be concentrated into a high purity of 99.9% or higher, by supplying the mixed gas to a column while controlling a column outlet in a reduced pressure state without using a gas for transferring a gas to be treated, when concentrating the mixed gas, as is shown in Examples 1 to 3. The method is extremely effective because the apparatus is small and inexpensive, and a concentration of the gas after having been concentrated is high. In addition, the method can prevent gases from diffusing out of the system because the system is operated under negative pressure, and the system can be thus operated more safely than a pressurized system. The method also can efficiently and continuously treat the gas to be treated by using a plurality of separators (columns) sequentially.

The invention claimed is:

1. A gas separation apparatus for separating a specified gas from a gas to be treated containing the specified gas including at least one ingredient, comprising:
    a separation unit that separates the specified gas from the other gases by using a column packed with a packing material; and a suction unit that controls the inside of the column to a pressure, which is 1,000 Pa or less, as an absolute pressure, while the specified gas is separated from the other gases by passing the gas to be treated through the column,
    wherein the separation unit separates the specified gas without using another gas for transferring the gas to be treated.

2. The gas separation apparatus according to claim 1, wherein the separation unit separates the specified gas from the other gases based on a difference in retention time.

3. The gas separation apparatus according to claim 1, further comprising a concentration unit that concentrates the specified gas in the gas to be treated.

4. The gas separation apparatus according to claim 3, further comprising a return unit that returns a treated gas which is not yet separated but has been exhausted from the separation unit, to the separation unit or the concentration unit.

5. The gas separation apparatus according to claim 4, further comprising a second concentration unit that concentrates the specified gas in the separated gas.

6. The gas separation apparatus according to claim 1, wherein the specified gas is a PFC gas.

7. The gas separation apparatus according to claim 6, wherein the PFC gas includes any one of fluorine compounds containing at least one constituent element selected from the group consisting of C, N and S.

8. The gas separation apparatus according to claim 7, wherein the PFC gas includes any one compound selected from the group consisting of $CF_4$, $C_2F_6$, $C_3F_8$, $CHF_3$, $SF_6$, $NF_3$ and $COF_2$.

9. The gas separation apparatus according to claim 6, wherein the gas to be treated includes nitrogen.

10. The gas separation apparatus according to claim 9, wherein the PFC gas is $SF_6$ and the packing material is Molecular Sieve 13X.

11. The gas separation apparatus according to claim 1, wherein the separation unit comprises a plurality of columns and the plurality of the columns are operated sequentially.

12. A gas separation method for separating a specified gas from a gas to be treated containing the specified gas containing at least one ingredient, comprising:
    separating the specified gas from the other gases by passing the gas to be treated through a column packed with a packing material while controlling the inside of the column at a pressure, which is 1,000 Pa or less,
    wherein a gas for transferring the gas to be treated is not used in the separating.

13. The gas separation method according to claim 12, further comprising concentrating the specified gas contained in the gas to be treated prior to the separating.

14. The gas separation method according to claim 13, further comprising returning a treated gas which is not yet separated but has been exhausted from the separating, to the separating or the concentrating.

15. The gas separation method according to claim 14, further comprising second concentrating the specified gas in the separated gas, after the separating.

16. The gas separation method according to claim 12, wherein, in the separating step, the specified gas is separated from the other gases based on a difference in retention time.

* * * * *